(12) United States Patent
Mizutani et al.

(10) Patent No.: US 9,396,926 B2
(45) Date of Patent: Jul. 19, 2016

(54) CLEANING COMPOSITION, CLEANING PROCESS, AND PROCESS FOR PRODUCING SEMICONDUCTOR DEVICE

(71) Applicant: FUJIFILM Corporation, Minato-Ku, Tokyo (JP)

(72) Inventors: Atsushi Mizutani, Haibara-gun (JP); Hideo Fushimi, Haibara-gun (JP); Tomonori Takahashi, Haibara-gun (JP); Kazutaka Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 143 days.

(21) Appl. No.: 14/158,454

(22) Filed: Jan. 17, 2014

(65) Prior Publication Data

US 2014/0135246 A1    May 15, 2014

Related U.S. Application Data

(62) Division of application No. 13/050,666, filed on Mar. 17, 2011, now Pat. No. 8,669,217.

(30) Foreign Application Priority Data

Mar. 25, 2010    (JP) .................................. 2010-070821

(51) Int. Cl.
*H01L 21/02*    (2006.01)
*C11D 7/26*    (2006.01)
(Continued)

(52) U.S. Cl.
CPC .......... *H01L 21/02076* (2013.01); *C11D 7/261* (2013.01); *C11D 7/265* (2013.01); *C11D 7/3209* (2013.01); *C11D 11/0047* (2013.01); *H01L 21/02063* (2013.01); *H01L 21/02071* (2013.01)

(58) Field of Classification Search
CPC .................................................. C11D 11/0047
See application file for complete search history.

(56) References Cited

U.S. PATENT DOCUMENTS 5,597,678 A * 1/1997 Honda et al. .................. 430/331
6,033,993 A   3/2000 Love et al.
(Continued)

FOREIGN PATENT DOCUMENTS

CN    101246317 A    8/2008
JP    11-316465 A    11/1999
(Continued)

OTHER PUBLICATIONS

Taiwanese Office Action dated May 5, 2015, issued in Taiwanese application No. 100109727.
(Continued)

*Primary Examiner* — Gregory Webb
(74) *Attorney, Agent, or Firm* — Sughrue Mion, PLLC

(57) ABSTRACT

A cleaning method is provided that includes a step of preparing a cleaning composition containing 57 to 95 wt % of (component a) water, 1 to 40 wt % of (component b) a secondary hydroxy group- and/or tertiary hydroxy group-containing hydroxy compound, (component c) an organic acid, and (component d) a quaternary ammonium compound, the composition having a pH of 5 to 10, and a step of removing plasma etching residue formed above a semiconductor substrate by means of the cleaning composition. There are also provided a process for producing a semiconductor device that includes a step of cleaning plasma etching residue formed above a semiconductor substrate using the cleaning method, and a cleaning composition for removing plasma etching residue formed above a semiconductor substrate that contains 57 to 95 wt % of (component a) water, 1 to 40 wt % of (component b) a secondary hydroxy group- and/or tertiary hydroxy group-containing hydroxy compound, (component c) an organic acid, and (component d) a quaternary ammonium compound, the composition having a pH of 5 to 10.

20 Claims, 3 Drawing Sheets

(51) Int. Cl.
*C11D 7/32* (2006.01)
*C11D 11/00* (2006.01)

(56) References Cited

U.S. PATENT DOCUMENTS

| | | | |
|---|---|---|---|
| 6,589,439 B2 | 7/2003 | Honda et al. | |
| 7,879,783 B2 | 2/2011 | Wu | |
| 7,935,665 B2 | 5/2011 | Leon et al. | |
| 2003/0235996 A1* | 12/2003 | Leon et al. | 438/710 |
| 2004/0147420 A1* | 7/2004 | Zhou et al. | 510/176 |
| 2005/0014667 A1* | 1/2005 | Aoyama et al. | 510/175 |
| 2005/0089489 A1* | 4/2005 | Carter | 424/70.1 |
| 2006/0014656 A1* | 1/2006 | Egbe et al. | 510/175 |
| 2007/0179072 A1 | 8/2007 | Rao et al. | |
| 2008/0139436 A1* | 6/2008 | Reid | 510/176 |
| 2008/0169004 A1 | 7/2008 | Wu | |
| 2009/0107520 A1* | 4/2009 | Lee et al. | 134/2 |
| 2009/0215658 A1* | 8/2009 | Minsek et al. | 510/175 |
| 2009/0281017 A1* | 11/2009 | Suzuki et al. | 510/176 |
| 2009/0291873 A1 | 11/2009 | Tamboli | |
| 2010/0043823 A1 | 2/2010 | Lee | |
| 2010/0072418 A1 | 3/2010 | Mizutani et al. | |
| 2010/0261632 A1* | 10/2010 | Korzenski et al. | 510/175 |

FOREIGN PATENT DOCUMENTS

| | | |
|---|---|---|
| JP | 2000-214599 A | 8/2000 |
| JP | 2009-212383 A | 9/2009 |
| JP | 2009-278018 A | 11/2009 |
| TW | 200833824 A | 8/2008 |
| WO | 2008/023753 A1 | 2/2008 |

OTHER PUBLICATIONS

Office Action issued in Japanese Patent Application No. 2010-070821 dated Aug. 6, 2013.
Office Action issued in Chinese Patent Application No. 201110078415.7 dated Dec. 9, 2013.

* cited by examiner

CLEANING COMPOSITION, CLEANING PROCESS, AND PROCESS FOR PRODUCING SEMICONDUCTOR DEVICE

CROSS-REFERENCE TO RELATED APPLICATIONS

This application is a Divisional of co-pending application Ser. No. 13/050,666 filed on Mar. 17, 2011 which claims priority under 35 U.S.C. 119 from Japanese Patent Application No. 2010-070821 filed on Mar. 25, 2010. The entire contents of each of the above-defined applications are hereby incorporated by reference.

BACKGROUND OF THE INVENTION

1. Field of the Invention

The present invention relates to a cleaning composition, a cleaning process and a process for producing a semiconductor device.

2. Description of the Related Art

In the manufacture of a semiconductor integrated circuit, larger scale integration, higher density integration and finer line-width integration are proceeding. The manufacture of a integrated circuit adopts lithography process using a positive-type or a negative-type photoresist. A photoresist film formed on a semiconductor substrate is exposed through an exposing master such a photomask. A pattern formed by a photochemical reaction in the resist film results in a resist pattern corresponded to the image pattern of the exposing master by a development. In order to improve an anti-etching stability of the resist pattern, a post-baking or an UV curing are carried out as necessary. Subsequently, using the obtained resist pattern as a mask, an etching or an ion injection are carried out to the semiconductor substrate.

When a metal layer or an insulating layer of the semiconductor substrate is etched by plasma etching using the resist pattern as a mask, residue derived from the photoresist, the metal layer or the insulating layer occur above the semiconductor substrate. In order to remove the residue occurred above the substrate by plasma etching, a cleaning is carried out using a cleaning composition.

Subsequently a resist pattern, which has become unnecessary, is removed from the semiconductor substrate. Examples of the removal method include a wet method using a stripping solution and a dry method using a plasma ashing. In the plasma ashing method, the resist pattern is washed in a vacuum chamber by way of oxygen plasma accelerated by an electronic field in the direction of the electric field. In order to remove the residue occurred above the substrate by plasma ashing, a cleaning by using a cleaning composition is carried out. Hereinafter the residue occurred by plasma etching or the plasma ashing may be also called as 'plasma etching residue'.

For example, JP-A-11-316465 (JP-A denotes a Japanese unexamined patent application publication) discloses a post-ashing processing solution comprising 0.5 to 10 wt % of (a) a lower alkyl quaternary ammonium salt and 1 to 50 wt % of (b) a polyhydric alcohol.

Furthermore, JP-A-2000-214599 discloses a resist stripping agent composition comprising a polyvalent carboxylic acid and/or a salt thereof and water, the composition having a pH of less than 8.

BRIEF SUMMARY OF THE INVENTION

Problems to be Solved by the Invention

Accompanying technological progress, the structure formed above a semiconductor substrate employs wiring structures or interlayer insulating structures having various chemical compositions, and the properties of a residue occurring during plasma ashing also change. A cleaning process for removing the residue occurring during plasma etching or ashing needs to sufficiently remove residue and not damage the wiring structure or the interlayer insulating structure.

It is an object of the present invention to provide a cleaning composition and a cleaning process that can sufficiently remove plasma etching residue above a semiconductor substrate without damaging a wiring structure or an interlayer insulating structure, and a process for producing a semiconductor device that employ the cleaning process.

The object can be attained by means described in <1>, <12> or <14> below. They are described below together with <2> to <11> and <15> to <24>, which are preferred embodiments.

<1> A cleaning method comprising: a step of preparing a cleaning composition comprising 57 to 95 wt % of (component a) water, 1 to 40 wt % of (component b) a secondary hydroxy group- and/or tertiary hydroxy group-containing hydroxy compound, (component c) an organic acid, and (component d) a quaternary ammonium compound, the composition having a pH of 5 to 10; and a step of removing plasma etching residue formed above a semiconductor substrate by means of the cleaning composition, <2> the cleaning method according to <1> above, wherein component b above is a diol compound, <3> the cleaning method according to <2> above, wherein component b above is a compound comprising at least a secondary hydroxy group and a hydroxy group selected from the group consisting of a primary hydroxy group, a secondary hydroxy group and a tertiary hydroxy group, <4> the cleaning method according to <3> above, wherein component b above is a compound selected from the group consisting of dipropylene glycol, 2-methyl-2,4-pentanediol, and 1,3-butanediol, <5> the cleaning method according to <1> above, further comprising (component e) a hydroxylamine and/or a salt thereof, <6> the cleaning method according to <1> above, wherein component c above is a carboxylic acid containing only C, H, and O as constituent elements, <7> the cleaning method according to <6> above, wherein component c above is a compound selected from the group consisting of citric acid, lactic acid, glycolic acid, oxalic acid, acetic acid, propionic acid, valeric acid, isovaleric acid, succinic acid, malic acid, glutaric acid, maleic acid, fumaric acid, phthalic acid, 1,2,3-benzenetricarboxylic acid, salicylic acid, tartaric acid, gluconic acid, and malonic acid.

<8> the cleaning method according to <1> above, further comprising (component f) an amino group-containing carboxylic acid, <9> the cleaning method according to <8> above, wherein component f above is histidine or arginine, <10> the cleaning method according to <1> above, further comprising (component g) an inorganic acid and/or a salt thereof, <11> the cleaning method according to <10> above, wherein component g above is a compound selected from the group consisting of phosphoric acid, boric acid, ammonium phosphate, and ammonium borate, <12> a process for producing a semiconductor device, comprising a step of cleaning plasma etching residue formed above a semiconductor substrate using the cleaning method according to <1> above, <13> the process for producing a semiconductor device according to <12> above, wherein the semiconductor substrate comprises aluminum or copper, <14> a cleaning composition for removing plasma etching residue formed above a semiconductor substrate, comprising: 57 to 95 wt % of (component a) water; 1 to 40 wt % of (component b) a secondary hydroxy group- and/or tertiary hydroxy group-containing hydroxy compound; (component c) an organic acid; and (component d) a quaternary ammonium compound; the composition having a pH of 5 to 10, <15> the cleaning composition according to <14> above, wherein component b above is a diol compound, <16> the cleaning composition according to <15> above, wherein component b above is a compound comprising at least a secondary hydroxy group and a hydroxy group selected from the group consisting of a primary hydroxy group, a secondary hydroxy group and a tertiary hydroxy group, <17> the cleaning composition according to <16> above, wherein component b above is a compound selected from the group consisting of dipropylene glycol, 2-methyl-2,4-pentanediol, and 1,3-butanediol, <18> the cleaning composition according to <14> above, further comprising (component e) a hydroxylamine and/or a salt thereof, <19> the cleaning composition according to <14> above, wherein component c above is a carboxylic acid containing only C, H, and O as constituent elements, <20> the cleaning composition according to <19> above, wherein component c above is a compound selected from the group consisting of citric acid, lactic acid, glycolic acid, oxalic acid, acetic acid, propionic acid, valeric acid, isovaleric acid, succinic acid, malic acid, glutaric acid, maleic acid, fumaric acid, phthalic acid, 1,2,3-benzenetricarboxylic acid, salicylic acid, tartaric acid, gluconic acid, and malonic acid, <21> the cleaning composition according to <14> above, further comprising (component f) an amino group-containing carboxylic acid, <22> the cleaning composition according to <21> above, wherein component f above is histidine or arginine, <23> the cleaning composition according to <14> above, further comprising (component g) an inorganic acid and/or a salt thereof, <24> the cleaning composition according to <23>, wherein component g above is a compound selected from the group consisting of phosphoric acid, boric acid, ammonium phosphate, and ammonium borate.

In accordance with the present invention, there can be provided a cleaning composition and a cleaning process that can sufficiently remove plasma etching residue above a semiconductor substrate without damaging a wiring structure or an interlayer insulating structure, and a process for producing a semiconductor device that employ the cleaning composition and the cleaning process.

DETAILED DESCRIPTION OF THE INVENTION

Figure 1A:
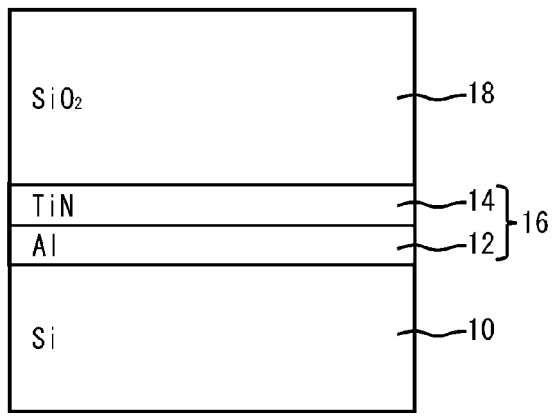
FIGS. 1A to 1D are cross-sectional views schematically showing steps of the process for producing a semiconductor device of the present invention.
Figure 1B:
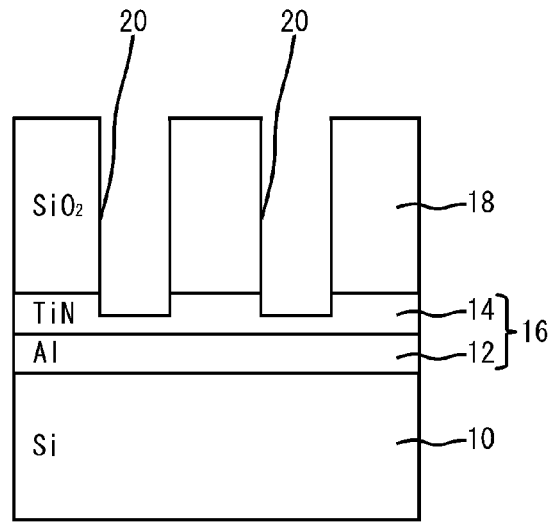

The present invention is explained in detail below. In the present invention, the notation 'A to B', which expresses a numerical range, means 'at least A but no greater than B'.

Cleaning Composition

The cleaning method of the present invention comprises a step of preparing a cleaning composition comprising 57 to 95 wt % of (component a) water, 1 to 40 wt % of (component b) a secondary hydroxy group- and/or tertiary hydroxy group-containing hydroxy compound, (component c) an organic acid, and (component d) a quaternary ammonium compound, the composition having a pH of 5 to 10, and a step of removing plasma etching residue formed above a semiconductor substrate by means of the cleaning composition.

As described later, the cleaning method of the present invention is preferably used for removal of plasma etching residue formed after plasma etching of an aluminum- or copper-containing metal film. Specifically, it can be used suitably for removal of residue formed by plasma etching or plasma ashing when forming wiring in a wiring structure of a semiconductor device, a via for connecting wires, or a pad to which an external electrode is connected by wire bonding, etc.

(Component a) to (component d), which are essential, and the pH of the cleaning composition used in the cleaning method of the present invention are explained in sequence below.

(Component a) Water

The cleaning composition of the present invention contains water as a solvent. The content of water is 57 to 95 wt % and preferably 70 to 90 wt % relative to the total weight of the cleaning composition.

As water, ultrapure water used for semiconductor production is preferable.

(Component b) Secondary Hydroxy Group- and/or Tertiary Hydroxy Group-Containing Hydroxy Compound The cleaning composition of the present invention comprises a secondary hydroxy group- and/or tertiary hydroxy group-containing hydroxy compound.

The hydroxy compound is not particularly limited as long as it contains a secondary hydroxy group and/or a tertiary hydroxy group, but is preferably a compound containing at least a secondary hydroxy group, and more preferably a compound containing at least a secondary hydroxy group and a hydroxy group selected from the group consisting of a primary hydroxy group, a secondary hydroxy group and a tertiary hydroxy group. In addition, the hydroxy compound does not have a carboxy group.

Furthermore, the hydroxy compound may be a monoalcohol compound or a polyalcohol compound, but is preferably a diol compound.

Adding the hydroxy compound to the cleaning composition enables an organic material in plasma etching residue to be dissolved sufficiently, thereby sufficiently cleaning and removing plasma etching residue. In particular, plasma etching residue formed when forming in an insulating film an opening for exposing a pad in a semiconductor device can be sufficiently cleaned and removed.

It is preferable to select as the hydroxy compound one having a Hansen solubility parameter (HSP: Hansen Solubility Parameter) value (HSP value) that is close or equal to the HSP value of the plasma etching residue to be dissolved.

Specific examples of the hydroxy compound include dipropylene glycol (1,1'-oxydi(2-propanol)), 2-methyl-2,4-pentanediol, 1,3-butanediol, 2-butanol, 1,2-cyclohexanediol, pinacol, glycerin, 1-amino-2-propanol. Among them, di-propyleneglycol, 2-methyl-2,4-pentanediol, and 1,3-butanediol are preferable.

The content of the hydroxy compound is 1 to 40 wt % relative to the total weight of the cleaning composition of the present invention, and more preferably 1 to 40 wt %.

(Component c) Organic Acid

The cleaning composition of the present invention comprises at least one organic acid, and the organic acid preferably comprises at least one carboxylic group. An organic acid is useful as a corrosion inhibitor for a metal.

Among carboxylic acids, a hydroxycarboxylic acid, which is a carboxylic acid having a hydroxy group, prevents effectively metal corrosion of aluminum, copper, and an alloy thereof. Carboxylic acids have an effect of chelating these metals. Preferred examples of the carboxylic acid include a monocarboxylic acid and a polycarboxylic acid. Examples of the carboxylic acid include, but are not limited to, citric acid, lactic acid, glycolic acid, oxalic acid, acetic acid, propionic acid, valeric acid, isovaleric acid, succinic acid, malic acid, glutaric acid, maleic acid, fumaric acid, phthalic acid, 1,2,3-benzenetricarboxylic acid, salicylic acid, tartaric acid, gluconic acid, malonic acid, and mixtures thereof. Among them, citric acid, glycolic acid, acetic acid, glutaric acid, fumaric acid, phthalic acid, gluconic acid, malonic acid, and mixtures thereof may preferably be used, and citric acid, glycolic acid and malonic acid may more preferably be used. It is preferable that the carboxylic acid is formed only from C, H, and O as constituent elements, and it is more preferable that it does not have an amino group.

The organic acid is added preferably at about 0.01 to about 30.0 wt % relative to the total weight of the cleaning composition of the present invention, more preferably about 0.05 to about 20.0 wt %, and particularly 0.1 to 10.0 wt %.

(Component d) Quaternary Ammonium Compound

The cleaning composition of the present invention comprises a quaternary ammonium compound.

Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate, and among them a quaternary ammonium hydroxide is preferable.

The quaternary ammonium hydroxide used as the quaternary ammonium compound of the cleaning composition of the present invention is preferably a tetraalkylammonium hydroxide, and more preferably a lower (1 to carbons) alkyl group- or aromatic alkyl group-substituted tetraalkylammonium hydroxide; specific examples thereof include a tetraalkylammonium hydroxide containing four alkyl groups from any of methyl, ethyl, propyl, butyl, hydroxyethyl, and benzyl. Such tetraalkylammonium hydroxides include tetramethylammonium hydroxide (hereinafter, called TMAH), tetraethylammonium hydroxide, tetrabutylammonium hydroxide (TBAH), trimethylhydroxyethylammonium hydroxide, methyltri(hydroxyethyl)ammonium hydroxide, tetra(hydroxyethyl)ammonium hydroxide, benzyltrimethylammonium hydroxide (hereinafter, called BTMAH), etc. In addition thereto, a combination of ammonium hydroxide and one or more quaternary ammonium hydroxides may also be used.

Among them, TMAH, tetraethylammonium hydroxide, TBAH, trimethylhydroxyethylammonium hydroxide, methyltri(hydroxyethyl)ammonium hydroxide, tetra(hydroxyethyl)ammonium hydroxide, BTMAH are preferable, TMAH, TBAH and BTMAH are more preferable, and TMAH are yet more preferable.

The content of the quaternary ammonium compound is preferably about 0.01 to about 20 wt % relative to the total weight of the cleaning composition of the present invention, more preferably 1.0 to 15 wt %, and yet more preferably 3.0 to 10 wt %.

(The pH of the Cleaning Composition)

The pH of the cleaning composition of the present invention is 5 to 10, preferably 5 to 8.5, and more preferably 6 to 8. When the pH is within the above-mentioned range of numerical values, sufficient removal of photoresist, anti-reflection film, etching residue, and ashing residue can be achieved. By making the pH be in this region, it is possible to completely remove residue when forming a via pattern by plasma etching of silicon oxide and a metal layer.

As a method for measuring pH, measurement can be carried out using a commercial pH meter.

In order to adjust the cleaning composition so as to have a predetermined pH, titration involving adjustment of the amount of basic amine and/or quaternary ammonium compound added can be carried out.

The cleaning composition of the present invention may comprise, in addition to the above-mentioned components (component a) to (component d), any one or more components of (component e) to (component j) as listed below.

(Component e) Hydroxylamine and/or Salt Thereof

The cleaning composition of the present invention may comprise, in addition to the above-mentioned quaternary ammonium compound, at least one hydroxylamine and/or a salt thereof. The salt of a hydroxylamine is preferably an inorganic acid salt or an organic acid salt of a hydroxylamine, more preferably an inorganic acid salt formed by a non-metal such as Cl, S, N, or P bonding with hydrogen, and particularly preferably an acid salt of any of hydrochloric acid, sulfuric acid, and nitric acid.

As the salt of a hydroxylamine used to form the cleaning composition of the present invention, hydroxylammonium nitrate (also called HAN), hydroxylammonium sulfate (also called HAS), hydroxylammonium phosphate, hydroxylammonium hydrochloride, and mixtures thereof are preferable.

An organic acid salt of a hydroxylamine may also be used in the cleaning composition, and examples thereof include hydroxylammonium citrate and hydroxylammonium oxalate, Examples of an inorganic salt include hydroxylammonium fluoride, N,N-diethylhydroxylammonium sulfate, and N,N-diethylhydroxylammonium nitrate.

The hydroxylamine and/or salt thereof is preferably contained at about 0.01 to about 30 wt % relative to the total weight of the cleaning composition of the present invention, and more preferably 0.1 to 15 wt %.

The hydroxylamine and/or salt thereof makes removal of plasma etching residue easy and prevents corrosion of a metal substrate.

(Component f) Amino Group-Containing Carboxylic Acid

The cleaning composition of the present invention may comprise an amino group-containing carboxylic acid. An amino group-containing carboxylic acid is preferable in terms of efficient removal of residue containing metal.

Examples of the amino group-containing carboxylic acid include amino group-containing carboxylic acids comprising nitrogen-containing heterocyclic ring such as histidine, diamino monocarboxylic acids such as arginine, and the following group of aminopolycarboxylates including ethylenediaminetetraacetate (EDTA), diethylenetriaminepentaacetate (DTPA), hydroxyethyl ethylenediaminetriacetate (HEDTA), dihydroxyethyl ethylenediaminetetraacetate (DHEDDA), nitrilotriacetate (NTA), hydroxyethyl iminodiacetate (HIDA), β-alaninediacetate, aspartic acid diacetate, methylglycinediacetate, iminodisuccinate, serine diacetate, hydroxyiminodisuccinate, dihydroxyethyl glycinate, aspartate, glutamate, etc.

In addition, as salts thereof, an ammonium salt, an alkanolamine (monoethanolamine, triethanolamine, etc.) salt, etc. can be cited. One type thereof or a combination of two or more types may be used.

As (component f) amino group-containing carboxylic acid, histidine and/or arginine are preferable.

When the cleaning composition of the present invention contains (component f) an amino group-containing carboxylic acid, the amount thereof added may be selected as appropriate, but it is preferably about 0.001 to about 5 wt % relative to the total weight of the cleaning composition of the present invention, and more preferably 0.01 to 3 wt %.

(Component g) Inorganic Acid and/or Salt Thereof

The cleaning composition of the present invention may comprise at least one inorganic acid and/or a salt thereof.

Due to the inorganic acid and/or a salt thereof contained in the cleaning composition, the surface of aluminum on a cleaning target such as a semiconductor substrate can be made smooth, and cleaning performance can be improved. Furthermore, corrosion of aluminum can be prevented or suppressed. Since an inorganic acid and/or a salt thereof is contained in the cleaning composition, compared with a case in which it is not contained, the temperature range of the cleaning composition over which sufficient cleaning can be realized while preventing or suppressing corrosion and the time range over which a cleaning target can be immersed in the cleaning composition can be widened.

Examples of the inorganic acid used in the cleaning composition of the present invention include phosphoric acid, boric acid, hexafluorophosphoric acid, and mixtures thereof.

Furthermore, salts of the above-mentioned inorganic acids may be used in the cleaning composition, and examples thereof include ammonium salts of the above-mentioned inorganic acids. Specific examples include ammonium phosphate, ammonium borate, ammonium tetrafluorophosphate, and mixtures thereof.

Among them, phosphoric acid and a phosphate are preferable, and phosphoric acid is more preferable.

The cleaning composition of the present invention may contain the inorganic acid and/or the salt thereof at 0.1 to 0.5 wt % relative to the total weight of the cleaning composition of the present invention, preferably 0.1 to 0.4 wt %, and more preferably 0.15 to 0.3 wt %.

(Component h) Surfactant

The cleaning composition of the present invention may comprise a surfactant. As the surfactant, nonionic, anionic, cationic, and amphoteric surfactants may be used.

With regard to the surfactant used in the present invention, in terms of adjusting the viscosity of the cleaning composition and improving the wettability toward the cleaning target due to its addition and in terms of corrosion prevention of an insulating film, etc. being excellent, a nonionic surfactant may preferably be used. Examples of the nonionic surfactant include a polyalkylene oxide alkyl phenyl ether-based surfactant, a polyalkylene oxide alkyl ether-based surfactant, a polyethylene oxide/polypropylene oxide block copolymer-based surfactant, a polyoxyalkylene distyrenated phenyl ether-based surfactant, a polyalkylene tribenzyl phenyl ether-based surfactant, and an acetylene polyalkylene oxide-based surfactant.

Among them, a polyalkylene oxide alkyl ether-based surfactant is preferable, the polyalkylene oxide (hereinafter called PAO) alkyl ether-based surfactant being selected from a PAO decyl ether, a PAO lauryl ether, a PAO tridecyl ether, a PAO alkylene decyl ether, a PAO sorbitan monolaurate, a PAO sorbitan monooleate, a PAO sorbitan monostearate, tetraoleic acid polyethylene oxide sorbitol, a PAO alkylamine, and a PAO acetylene glycol. As the polyalkylene oxide, a polymer of polyethylene oxide, polypropylene oxide, or polybutylene oxide is preferable.

Furthermore, as the surfactant used in the present invention, in terms of both removability of residue and corrosion prevention of a substrate, an insulating film, etc. being excellent, a cationic surfactant may also be used preferably. As the cationic surfactant, a quaternary ammonium salt-based surfactant or an alkylpyridinium-based surfactant is preferable.

As the quaternary ammonium salt-based surfactant, a compound represented by Formula (1) below is preferable.

(1)

wherein $X^-$ denotes hydroxide ion, chloride ion, bromide ion, or nitrate ion, $R_1$ denotes an alkyl group having 8 to 18 carbons, $R_2$ and $R_3$ independently denote an alkyl group having 1 to 18 carbons, an aryl group, a hydroxyalkyl group having 1 to 8 carbons, or a benzyl group, and $R_4$ denotes an alkyl group having 1 to 3 carbons.

In Formula (1), $X^-$ denotes a counter anion, and specifically denotes hydroxide ion, chloride ion, bromide ion, or nitrate ion.

In Formula (1), $R_1$ is an alkyl group having 8 to 18 carbons (preferably 12 to 18 carbons, examples thereof including a cetyl group and a stearyl group).

In Formula (1), $R_2$ and $R_3$ independently denote an alkyl group having 1 to 18 carbons, a hydroxyalkyl group having 1 to 8 carbons (e.g. hydroxyethyl, etc.), an aryl group (e.g. a phenyl group etc.), or a benzyl group.

In Formula (1), $R_4$ denotes an alkyl group having 1 to 3 carbons (e.g. a methyl group, an ethyl group, etc.).

Specific examples of the compound represented by Formula (1) include cetyltrimethylammonium chloride, didodecyldimethylammonium chloride, tridecylmethylammonium chloride, and stearylbenzyldimethylammonium chloride. The counter anion of these compounds is not limited to chloride ion, and it may be bromide ion or hydroxide ion.

Furthermore, specific examples of the alkylpyridinium-based surfactant include cetylpyridinium chloride. The counter anion of these compounds is not limited to chloride ion, and it may be bromide ion or hydroxide ion.

The content of the surfactant in the cleaning composition is preferably 0.0001 to 5 wt % relative to the total weight of the cleaning composition, and more preferably 0.0001 to 1 wt %. It is preferable to add a surfactant to the cleaning composition since the viscosity of the cleaning composition can be adjusted and wettability toward the cleaning target can be improved and, in addition, it is preferable in terms of corrosion resistance of a substrate, an insulating film, etc. being better. Such a surfactant is generally available commercially. These surfactants may be used singly or in a combination of a plurality thereof.

(Component i) Water-Soluble Organic Solvent

The cleaning composition of the present invention may comprise a water-soluble organic solvent. A water-soluble organic solvent is desirable in terms of corrosion prevention. Examples thereof include ether-based solvents such as ethylene glycol monomethyl ether, diethylene glycol, diethylene glycol monomethyl ether, triethylene glycol, polyethylene glycol, 2-methoxy-1-propanol, and diethylene glycol monobutyl ether, amide-based solvents such as formamide, monomethylformamide, dimethylformamide, acetamide, monomethylacetamide, dimethylacetamide, monoethylacetamide, diethylacetamide, and N-methylpyrrolidone, sulfur-containing solvents such as dimethyl sulfone, dimethyl sulfoxide, and sulfolane, and lactone-based solvents such as γ-butyrolactone and δ-valerolactone. Among them, ether-based, amino-based and sulfur-containing solvents are preferable, and N-methylpyroridone and dimethylsulfoxide are more preferable. The water-soluble organic solvents may be used singly or in an appropriate combination of two or more types.

The content of the water-soluble organic solvent in the cleaning composition is preferably 0 to 40 wt % relative to the total weight of the cleaning composition, more preferably 0 to 20 wt %, and yet more preferably 0.0001 to 15 wt %. It is preferable to add a water-soluble organic solvent to the cleaning composition since corrosion of a metal film can be prevented.

(Component i) Corrosion Inhibitor

The cleaning composition of the present invention may comprise a corrosion inhibitor.

The corrosion inhibitor is preferably a heterocyclic compound, and more preferably benzotriazole or a derivative thereof. Preferred examples of the derivative include 5,6-dimethyl-1,2,3-benzotriazole (DBTA), 1-(1,2-dicarboxyethyl)benzotriazole (DCEBTA), 1-[N,N-bis(hydroxyethyl) aminomethyl]benzotriazole (HEABTA), and 1-(hydroxymethyl)benzotriazole (HMBTA).

The corrosion inhibitor used in the present invention may be used singly or in a combination of two or more types. Furthermore, the corrosion inhibitor used in the present invention may be synthesized by a standard method or a commercial product may be used.

The amount of corrosion inhibitor added is preferably at least 0.01 wt % but no greater than 0.2 wt % relative to the total weight of the cleaning composition, and more preferably at least 0.05 wt % but no greater than 0.2 wt %.

Cleaning Process and Process for Producing Semiconductor Device

The cleaning process and the process for producing semiconductor device of the present invention are now explained in detail. The process for producing a semiconductor device of the present invention is characterized to apply the cleaning composition or the cleaning process of the present invention_in a washing process_of a semiconductor substrate after forming a via hole or wiring.

Several embodiments are illustrated below.

First Embodiment

FIGS. 1A to 1 are cross-sectional views schematically showing steps of the process for producing a semiconductor device based on a first embodiment of the present invention.

First, a transistor or another device or one or more layers of wiring are formed above a semiconductor substrate 10 such as a silicon wafer by a standard process for producing a semiconductor device. Subsequently, an interlayer insulating film is formed above the semiconductor substrate 10 having a device, etc. formed thereabove.

Subsequently, the entire face is subjected to sequentially layering by, for example, a CVD (Chemical Vapor Deposition) method an Al alloy film 12 having a film thickness of, for example, about 500 nm and a titanium nitride film 14 having a film thickness of, for example, about 50 nm. In this way, a conductor film having the Al alloy film 12 and the titanium nitride film 14 sequentially layered is formed. The Al alloy film 12 is an Al—Cu alloy film containing, for example, 0.1% to 5% Cu.

Next, the conductor film is subjected to patterning by photolithography and dry etching. In this way, wiring 16 formed from the Al alloy film 12 and the titanium nitride film 14 is formed.

Next, a silicon oxide film 18 having a film thickness of, for example, about 500 nm is formed on the entire face by, for example, a CVD method.

Next, the surface of the silicon oxide film 18 is polished by, for example, a CMP (Chemical Mechanical Polishing) method, thus planarizing the surface of the silicon oxide film 18 (see FIG. 1A).

Next, a photoresist film having a via pattern is formed above the silicon oxide film 18 by photolithography. Subsequently, the silicon oxide film 18 is etched by dry etching employing plasma using this photoresist film as a mask. In this process, an upper part of the titanium nitride film 14 below the silicon oxide film 18 is also etched. In this way, a via hole (via pattern) 20 reaching the titanium nitride film 14 of the wiring 16 is formed in the silicon oxide film 18 (see FIG. 1B). Dry etching of the silicon oxide film 18 and the upper part of the titanium nitride film 14 may each be carried out by known methods.

Next, the photoresist film used as a mask is removed by ashing employing plasma. Ashing of the photoresist film may be carried out using a known method.

In dry etching for forming the via hole 20 and ashing for removing the photoresist film, residue (plasma etching residue) derived from the degenerated photoresist film, silicon oxide film 18, and titanium nitride film 14 exposed on the bottom of the via hole 20 becomes attached to the substrate surface, including the surface around the via hole 20.

After ashing for removing the photoresist film, the semiconductor substrate 10 having the via hole 20 already formed thereabove is subjected to cleaning by means of the cleaning composition of the present invention. In this way, plasma etching residue attached to the surface of the semiconductor substrate 10 having the via hole 20 already formed are removed.

Next, a tungsten film is formed on the entire face by, for example, a CVD method.

Next, the tungsten film is polished by, for example, a CMP method until the surface of the silicon oxide film 18 is exposed. In this way, a via formed from tungsten is embedded within the via hole 20.

Second Embodiment

Figure 1C:
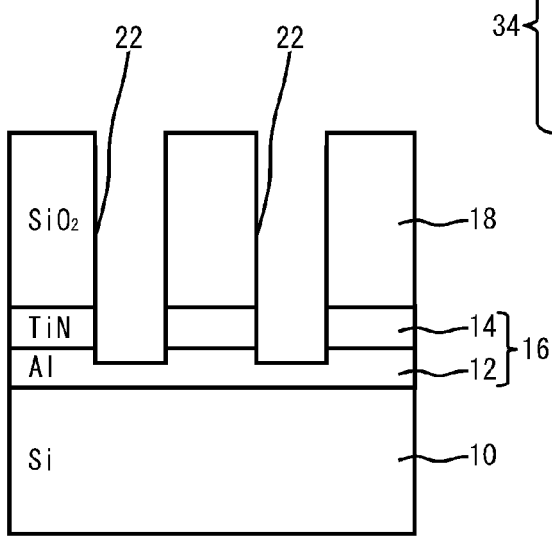

A process for producing a semiconductor device in accordance with a second embodiment of the present invention is now explained briefly by reference also to FIGS. 1A and 1C. The process for producing a semiconductor device in accordance with the present embodiment is different from the process for producing a semiconductor device in accordance with the first embodiment in terms of forming a via hole 22 that reaches an Al alloy film 12 of wiring 16.

First, the wiring 16 formed from the Al alloy film 12 and a titanium nitride film 14 and a silicon oxide film 18 are formed above a semiconductor substrate 10 in the same manner as in the process for producing a semiconductor device in accordance with the first embodiment (see FIG. 1A).

Next, a photoresist film having a via pattern is formed above the silicon oxide film 18 by photolithography. Subsequently, the silicon oxide film 18 and the titanium nitride film 14 are etched by plasma dry etching using this photoresist film as a mask. In this process, an upper part of the Al alloy film 12 beneath the titanium nitride film 14 is also etched. In this way, the via hole 22 (via pattern) that reaches the Al alloy film 12 of the wiring 16 is formed in the silicon oxide film 18 and the titanium nitride film 14 (see FIG. 1C). Dry etching of the silicon oxide film 18, the titanium nitride film 14, and the upper part of the Al alloy film 12 may each be carried out by known methods.

Next, the photoresist film used as a mask is removed by ashing employing plasma. Ashing of the photoresist film may be carried out using a known method.

In the case of the present embodiment, during dry etching for forming the via hole 22 and ashing for removing the photoresist film, plasma etching residue become attached to the substrate surface including the surface around the via hole 22 and a wall face of the via hole 22. In the case of the present embodiment, plasma etching residue is derived not only from the degenerated photoresist film, silicon oxide film 18, and titanium nitride film 14 but also from the Al alloy film 12 exposed in the bottom of the via hole 22.

After ashing for removing the photoresist film, the semiconductor substrate 10 having the via hole 22 is subjected to cleaning by means of the cleaning composition of the present invention. In this way, plasma etching residue attached to the surface of the semiconductor substrate 10 having the via hole 22 already formed are removed.

Next, a via embedded in the via hole 22 is formed in the same manner as in the process for producing a semiconductor device in accordance with the first embodiment.

Third Embodiment

Figure 1D:
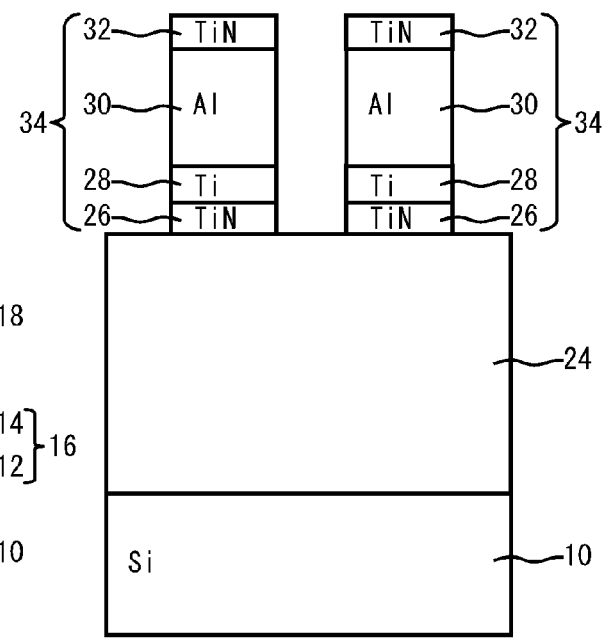
Figure 2:
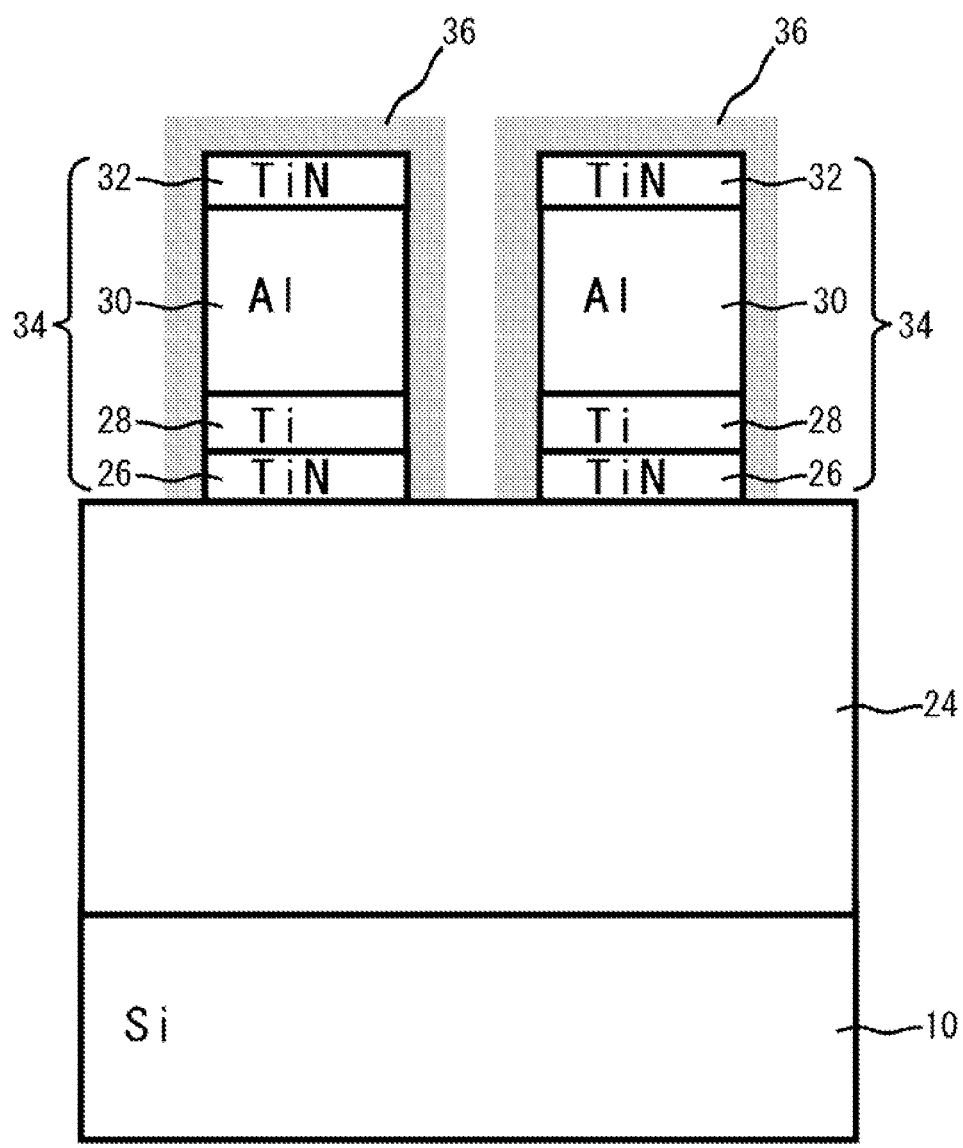
FIG. 2 is a cross-sectional view schematically showing a semiconductor device in a state in which plasma etching residue is attached after plasma ashing.

A process for producing a semiconductor device in accordance with a third embodiment of the present invention is now explained briefly by reference to FIGS. 1D and 2.

First, an interlayer insulating film 24 is formed above a semiconductor substrate 10 having a device, etc. formed thereabove in the same manner as in the process for producing a semiconductor device in accordance with the first embodiment.

Next, sequentially layered by, for example, a CVD method on the entire face thereof are a titanium nitride film 26 having a film thickness of, for example, about 50 nm, a titanium film 28 having a film thickness of, for example, about 20 nm, an Al alloy film 30 having a film thickness of, for example, about 500 nm, and a titanium nitride film 32 having a film thickness of, for example, about 50 nm. The Al alloy film 30 is, for example, an Al/Cu alloy film containing 0.1% to 5% Cu.

Next, a photoresist film having a wiring pattern is formed above the titanium nitride film 32 by photolithography. Subsequently, the titanium nitride film 32, the Al alloy film 30, the titanium film 28, and the titanium nitride film 26 are sequentially etched by plasma etching using this photoresist film as a mask. In this way, the titanium nitride film 32, the Al alloy film 30, the titanium film 28, and the titanium nitride film 26 are subjected to patterning, and wiring (wiring pattern) 34 comprising these conductor films is formed.

Next, the majority of the photoresist film used as a mask is stripped off by a wet treatment using a liquid reagent. Subsequently, the remaining part of the photoresist film is removed by ashing using plasma (see FIG. 1D).

In plasma etching for forming the wiring 34 and ashing for removing the remaining part of the photoresist film, as shown in FIG. 2, plasma etching residue 36 becomes attached to the substrate surface, including an upper face and a side face of the wiring 34. This plasma etching residue 36 is derived from the degenerated photoresist film, titanium nitride film 32, Al alloy film 30, titanium film 28, and titanium nitride film 26.

After ashing for removing the residual part of the photoresist film, the semiconductor substrate 10 having the wiring 34 already formed thereabove is subjected to cleaning by means of the cleaning composition of the present invention. In this way, plasma etching residue attached to the surface of the semiconductor substrate 10 having the wiring 34 already formed is removed.

Fourth Embodiment

The process for producing a semiconductor device in accordance with a fourth embodiment of the present invention is now briefly explained by reference to FIGS. 3A to 3D. FIGS. 3A to 3D are cross-sectional views schematically showing steps of the process for producing a semiconductor device based on the present embodiment. The process for producing a semiconductor device in accordance with the present embodiment forms in an insulating film such as a passivation film an opening for exposing a pad (pad electrode) formed in the uppermost part in a multilayer wiring structure above a semiconductor substrate.

In the multilayer wiring structure formed above the semiconductor substrate, a wiring pattern is formed in a layered interlayer insulating film. Furthermore, a via is appropriately formed in the interlayer insulating film, the via giving a connection between wiring patterns.

Figure 3A:
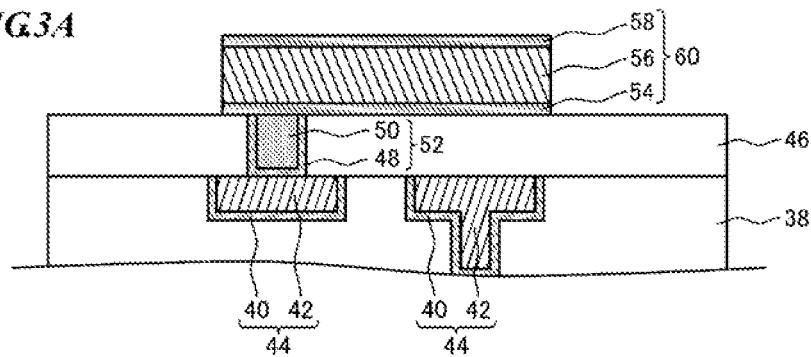
FIGS. 3A to 3D are cross-sectional views schematically showing steps of the process for producing a semiconductor device of the present invention.

FIG. 3A shows one example of the uppermost part of the multilayer wiring structure in which a pad has already been formed. As illustrated, a wiring pattern 44 is formed in an interlayer insulating film 38 formed above a semiconductor substrate (not illustrated). The wiring pattern 44 has a barrier metal film 40 such as TiN or a Ti film and an Al film 42 covered by the barrier metal film 40.

An interlayer insulating film 46 is formed above the interlayer insulating film 38 having the wiring pattern 44 already formed. A via 52 is formed in the interlayer insulating film 46, the via 52 being connected to the wiring pattern 44. The via 52 has a barrier metal film 48 such as a titanium nitride film and a tungsten film 50 covered by the barrier metal film 48.

A pad (pad electrode) 60 is formed above the interlayer insulating film 46 having the via 52 already formed, the pad 60 being connected to the wiring pattern 44 via the via 52. The pad 60 has an adhesion film 54, an Al film 56, and an adhesion film 58, which are sequentially layered. The adhesion films 54 and 58 have a multilayer structure of titanium/titanium nitride or a single layer structure of titanium nitride.

Figure 3B:
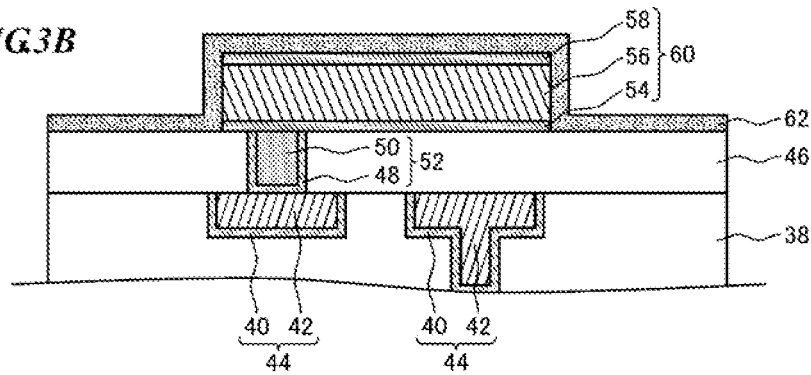
Figure 3C:
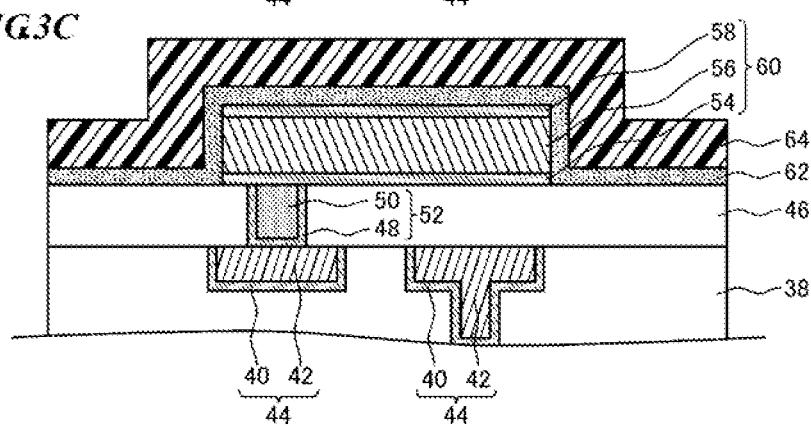
Figure 3D:
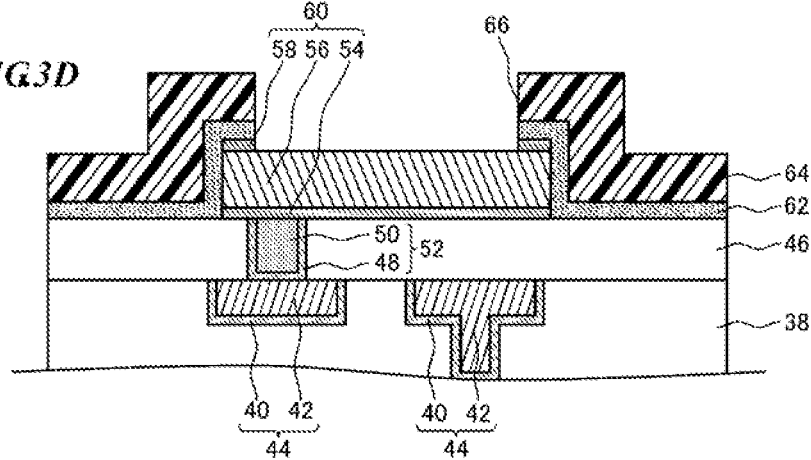

A silicon oxide film 62 is formed above the interlayer insulating film 46 on which the pad 60 has thus been formed, by for example a high density plasma CVD method (see FIG. 3B).

Next, a passivation film 64 is formed above the silicon oxide film 62 by, for example, a plasma CVD method from a silicon nitride film (see FIG. 3 C).

Next, a photoresist film (not illustrated) is formed above the passivation film 64 by photolithography, the photoresist film exposing an area in which an opening reaching to the pad 60 is to be formed. Subsequently, the passivation film 64 and the silicon oxide film 62 are etched by dry etching employing plasma using this photoresist film as a mask. In this process, upper parts of the adhesion film 58 and the Al film 56 of the pad 60 can also be etched. In this way, an opening 66 that exposes the pad 60 is formed in the passivation film 64 and the silicon oxide film 62 (see FIG. 3D). Dry etching of the passivation film 64 and the silicon oxide film 62 may each be carried out by known methods.

Next, the photoresist film used as a mask is removed by ashing employing plasma. Ashing of the photoresist film may be carried out using a known method.

In formation of the photoresist film, dry etching of the passivation film 64 and the silicon oxide film 62, and ashing for removing the photoresist film in order to form the opening 66, residue (plasma etching residue) becomes attached to the substrate surface, including the surface around the opening 66. This residue is derived from degenerated photoresist film, passivation film 64, silicon oxide 62, adhesion film 58, Al film 56, etc.

After ashing for removing the photoresist film, the semiconductor substrate having the opening 66 for exposing the pad 60 already formed is subjected to cleaning by means of the cleaning composition of the present invention. In this way, plasma etching residue attached to the surface of the semiconductor substrate having the opening 66 already formed is removed.

The cleaning composition of the present invention comprises (component b) a secondary hydroxy group- and/or tertiary hydroxy group-containing hydroxy compound. Because of this, in accordance with the cleaning composition of the present invention, not only plasma etching residue formed above a semiconductor substrate when forming the above-mentioned via hole or wiring, but also plasma etching residue formed above a semiconductor substrate when forming an opening for exposing a pad can be sufficiently cleaned and removed.

In the above-mentioned embodiments, cases in which wiring 16, 34 comprising the Al alloy film 12, 30 is formed are explained, but the material for wiring is not limited to those described above. With regard to the wiring, in addition to wiring employing as a main material Al formed from Al or an Al alloy, wiring employing as a main material Cu formed from Cu or a Cu alloy may be formed.

Furthermore, in the above-mentioned embodiments, cases in which the pad 60 having the adhesion film 54, the Al film 56, and the adhesion film 58 sequentially layered are explained, but materials of the pad are not limited to those described above. As a material for the pad, various metal materials may be used. Furthermore, cases in which the opening 66 for exposing the pad 60 is formed in the passivation film 64 formed from a silicon nitride film and the silicon oxide film 62 are explained, but an insulating film in which an opening is formed for exposing a pad is not limited to those above. As such an insulating film, various insulating films may be used.

Furthermore, the cleaning composition of the present invention may be widely used in a step of cleaning plasma etching residue from a semiconductor substrate containing aluminum or copper, and aluminum or copper is preferably contained in a wiring structure formed above a semiconductor substrate.

EXAMPLES

The present invention is explained in further detail below by reference to Examples. However, the present invention is not limited by these Examples.

Examination of Etching Residue by Scanning Electron Microscope

With regard to the first and second embodiments above, after forming the via hole and before cleaning using the cleaning process of the present invention, the patterned wafers were examined using a scanning electron microscope (SEM), and plasma etching residue was observed on the via hole wall face in both cases. Furthermore, with regard to the third embodiment above, after forming the wiring and before cleaning using the cleaning process of the present invention, the patterned wafer was examined using SEM, and plasma etching residue was observed on the upper face and side face of the wiring. Furthermore, with regard to the fourth embodiment above, after forming the opening for exposing the pad and before cleaning using the cleaning process of the present invention, the patterned wafer was examined using SEM, and plasma etching residue was observed on the opening side face and the upper face of the insulating film around the opening.

Examples 1 to 21 and Comparative Examples 1 to 6

Cleaning compositions 1 to 27 (Examples 1 to 21 and Comparative Examples 1 to 6) having the compositions shown in Table 1 below were prepared.

As a cleaning target, a patterned wafer after forming an aluminum wiring pattern by plasma etching, a patterned wafer after forming a via hole pattern by plasma etching, and a patterned wafer having a pad pattern after forming an opening for exposing a pad by plasma etching were prepared.

For each of the cleaning compositions, a piece (about 2.0 cm×2.0 cm) of a prepared patterned wafer was immersed for 15 minutes in the cleaning composition heated to 70° C., and subsequently the piece of patterned wafer was taken out, immediately washed with ultrapure water for 1 minute, and then dried with $N_2$.

The surface of the piece of patterned wafer after the immersion test was examined by SEM, and the removability (cleaning performance) for plasma etching residue was evaluated in accordance with the evaluation criteria below. For the wiring pattern, residue removability was evaluated for the upper face and the side face of the wiring. Furthermore, for the via hole pattern, residue removability was evaluated for the area around the via hole. For the pad pattern having an opening formed for exposing a pad, residue removability was evaluated for the opening side face and the upper face of the insulating film around the opening.

By examination using SEM, Al corrosion (recess) was evaluated for the wiring pattern, and Al corrosion of wiring exposed in the bottom of the via hole was evaluated for the via pattern.

The evaluation criteria are shown below. The evaluation results are shown in Table 2.

Cleaning Performance

Excellent: plasma etching residue was completely removed.
Good: plasma etching residue was almost completely removed.
Fair: incomplete dissolution of plasma etching residue.
Poor: hardly any plasma etching residue was removed.

The above evaluation criteria for the cleaning performance were used in common for the wiring pattern, the via pattern, and the pad pattern.

Al Corrosion

Excellent: corrosion of Al was not observed.
Good: corrosion of Al was observed at not more than 5% for wiring.
Fair: corrosion of Al was observed at not more than 10% for wiring.
Poor: Al wiring was completely lost.

The above evaluation criteria for the corrosion were used in common for the wiring pattern and the via pattern.

In the above-mentioned evaluation, it is desirable that the evaluation of cleaning performance and corrosion resistance is 'Excellent' in all cases. Furthermore, it is more desirable that the evaluation is 'Excellent' with a short time and a low temperature.

TABLE 1

| | (Component a) | (Component b) | | (Component c) | | (Component d) | | (Component e) | | (Component f) | | (Component g) | | |
|---|---|---|---|---|---|---|---|---|---|---|---|---|---|---|
| | — | | Content | Compound | Content (wt %) | Compound | Content | Compound | Content (wt %) | Compound | Content (wt %) | Compound | Content (wt %) | pH |
| Example 1 | Water | Remainder | DPG | 5 | CA | 2 | TMAH | (ph Adjustment) | HAS | 4 | His | 2 | — | — | 6.2 |
| Example 2 | Water | Remainder | BD | 7 | GA | 1 | TMAH | (ph Adjustment) | HAS | 2 | Arg | 1 | — | — | 7.6 |
| Example 3 | Water | Remainder | DPG | 10 | MNA | 0.5 | TMAH | (ph Adjustment) | HAS | 5 | — | — | PA | 0.5 | 7.4 |
| Example 4 | Water | Remainder | MPD | 20 | VA | 4 | TMAH | (ph Adjustment) | HAS | 10 | — | — | — | — | 7.0 |
| Example 5 | Water | Remainder | DPG | 13 | OA | 2 | TMAH | (ph Adjustment) | HAS | 10 | — | — | AP | 1 | 8.2 |
| Example 6 | Water | Remainder | Gly | 16 | GA | 3 | TBAH | (ph Adjustment) | HAS | 2 | — | — | — | — | 8.5 |
| Example 7 | Water | Remainder | BO | 4 | CA | 0.5 | BTMAH | (ph Adjustment) | HAS | 2 | — | — | — | — | 9.4 |
| Example 8 | Water | Remainder | MPD | 8 | MLA | 1 | BTMAH | (ph Adjustment) | HAS | 3 | — | — | BA | 0.7 | 7.8 |
| Example 9 | Water | Remainder | DPG | 11 | AA | 1.5 | TMAH | (ph Adjustment) | HAS | 6 | — | — | HFP | 2 | 8.2 |
| Example 10 | Water | Remainder | Gly | 16 | GTA | 1.6 | TMAH | (ph Adjustment) | HAS | 4 | — | — | — | — | 6.9 |
| Example 11 | Water | Remainder | Gly | 30 | IVA | 2.3 | TMAH | (ph Adjustment) | HAS | 8 | — | — | AHFP | 3 | 7.1 |
| Example 12 | Water | Remainder | TBO | 12 | FA | 2.4 | TBAH | (ph Adjustment) | HAS | 2 | — | — | — | — | 7.6 |
| Example 13 | Water | Remainder | CHD | 16 | SUA | 1.6 | TMAH | (ph Adjustment) | HAS | 5 | — | — | — | — | 7.7 |
| Example 14 | Water | Remainder | DPG | 14 | TA | 1 | TMAH | (ph Adjustment) | HAS | 4 | — | — | — | — | 5.2 |
| Example 15 | Water | Remainder | Pin | 16 | MA | 0.5 | TMAH | (ph Adjustment) | HAS | 5 | — | — | AB | 0.2 | 5.9 |
| Example 16 | Water | Remainder | Gly | 20 | BCA | 1 | TMAH | (ph Adjustment) | HAS | 5 | — | — | — | — | 6.0 |
| Example 17 | Water | Remainder | TBO | 12 | LA | 1 | TMAH | (ph Adjustment) | HAS | 2 | — | — | — | — | 6.5 |
| Example 18 | Water | Remainder | CHD | 34 | PHA | 2 | TMAH | (ph Adjustment) | HAS | 3 | — | — | — | — | 7.8 |
| Example 19 | Water | Remainder | DPG | 14 | SA | 5 | TMAH | (ph Adjustment) | HAS | 3 | — | — | — | — | 8.0 |
| Example 20 | Water | Remainder | APO | 13 | GLA | 2 | TMAH | (ph Adjustment) | HAS | 4 | — | — | — | — | 7.1 |
| Example 21 | Water | Remainder | APO | 6 | LA | 2 | TMAH | (ph Adjustment) | — | — | — | — | — | — | 7.6 |
| Comp. Ex. 1 | Water | Remainder | PGME | 14 | CA | 3 | TMAH | (ph Adjustment) | HAS | 6 | — | — | — | — | 8.3 |
| Comp. Ex. 2 | Water | Remainder | DEG | 11 | GA | 1 | TBAH | (ph Adjustment) | HAS | 4 | — | — | — | — | 5.9 |
| Comp. Ex. 3 | Water | Remainder | DPG | 11 | GA | 1 | TBAH | (ph Adjustment) | HAS | 4 | — | — | — | — | 4.9 |
| Comp. Ex. 4 | Water | Remainder | MPD | 50 | CA | 4 | TMAH | (ph Adjustment) | HAS | 7 | — | — | — | — | 7.0 |
| Comp. Ex. 5 | Water | Remainder | Gly | 11 | — | — | TBAH | (ph Adjustment) | HAS | 4 | — | — | — | — | 7.9 |
| Comp. Ex. 6 | Water | Remainder | MPD | 0.5 | SA | 5 | TBAH | (ph Adjustment) | HAS | 3 | — | — | — | — | 7.9 |

Compounds denoted by abbreviations in Table 1 above are as follows.
(Component b)
DPG: dipropylene glycol (1,1'-oxydi(2-propanol))
MPD: 2-methyl-2,4-pentanediol
BD: 1,3-butanediol
BO: 2-butanol
TBO: t-butanol
CHD: 1,2-cyclohexanediol
Pin: pinacol
Gly: glycerol
APO: 1-amino-2-propanol
PGME: 2-methoxy-1-propanol
DEG: diethylene glycol
(Component c)
CA: citric acid
GA: glycolic acid
LA: lactic acid
MNA: malonic acid
OA: oxalic acid
AA: acetic acid
PA: propionic acid
VA: valeric acid
IVA: isovaleric acid SUA: succinic acid
MA: malic acid
GTA: glutaric acid
MLA: maleic acid
FA: fumaric acid
PHA: phthalic acid
BCA: 1,2,3-benzenetricarboxylic acid
SA: salicylic acid
TA: tartaric acid
GLA: gluconic acid
FRA: formic acid
(Component d)
TMAH: tetramethylammonium hydroxide
TBAH: tetrabutylammonium hydroxide
BTMAH: benzyltrimethylammonium hydroxide
(Component e)
HAS: hydroxylammonium sulfate
(Component f)
His: histidine
Arg: arginine
(Component g)
PA: phosphoric acid
BA: boric acid
AP: ammonium phosphate
HFP: hexafluorophosphoric acid
AHFP: ammonium tetrafluorophosphate
AB: ammonium borate Furthermore, 'remainder' in the content of (component a) in Table 1 above means the remainder that makes the total of all components of (component a) to (component f) up to 100%. Moreover, '(pH adjustment)' for the content of (component d) means that (component d) is added so as to achieve the pH value shown in Table 1.

As shown in Table 2 above, in Examples 1 to 4 and 6 to 20, in which the cleaning composition and the cleaning method of the present invention were used, with regard to the wiring pattern, the via pattern, and the pad pattern, plasma etching residue was completely or substantially completely removed for all of them, and excellent cleaning performance was obtained. Furthermore, in Examples 1 to 21, Al corrosion was reliably or substantially reliably prevented for the wiring pattern and the via pattern.

Moreover, in cleaning employing the cleaning composition and the cleaning method of the present invention, the immersion temperature and the immersion time can be selected relatively freely, and cleaning at a low temperature for a short time is possible. Furthermore, in cleaning employing the cleaning composition of the present invention, corrosion of Al did not progress even under forcing conditions of an extended immersion time.

On the other hand, in Comparative Examples 1 to 6, with regard to the wiring pattern, the via pattern, and the pad pattern, good cleaning performance could not be obtained for any of them, and it was particularly difficult to obtain good cleaning performance for the pad pattern. For example, in Comparative Examples 1 and 2, good cleaning performance was obtained for the wiring pattern and the via pattern, but plasma etching residue could not be cleaned and removed for the pad pattern.

EXPLANATION OF REFERENCE NUMERALS AND SYMBOLS

10 Semiconductor substrate
12 Al alloy film

TABLE 2

| | Wiring pattern | | Via pattern | | Pad pattern Residue removability (cleaning |
|---|---|---|---|---|---|
| | Residue removability (cleaning performance) of wiring side face and upper face | Al corrosion (recess) | Residue removability (cleaning performance) of area around via hole | Al corrosion in bottom of via hole | performance) of opening side face/upper face of insulating film around opening |
| Example 1 | Excellent | Excellent | Excellent | Excellent | Excellent |
| Example 2 | Excellent | Excellent | Excellent | Excellent | Excellent |
| Example 3 | Excellent | Excellent | Excellent | Excellent | Excellent |
| Example 4 | Excellent | Good | Good | Good | Excellent |
| Example 5 | Excellent | Excellent | Fair | Excellent | Excellent |
| Example 6 | Excellent | Excellent | Good | Excellent | Excellent |
| Example 7 | Good | Good | Excellent | Good | Excellent |
| Example 8 | Excellent | Excellent | Good | Excellent | Good |
| Example 9 | Excellent | Excellent | Excellent | Excellent | Excellent |
| Example 10 | Excellent | Excellent | Excellent | Excellent | Excellent |
| Example 11 | Good | Good | Excellent | Good | Excellent |
| Example 12 | Excellent | Excellent | Excellent | Excellent | Excellent |
| Example 13 | Excellent | Excellent | Good | Excellent | Good |
| Example 14 | Excellent | Excellent | Good | Excellent | Excellent |
| Example 15 | Good | Good | Excellent | Good | Excellent |
| Example 16 | Excellent | Excellent | Good | Excellent | Excellent |
| Example 17 | Excellent | Good | Good | Excellent | Good |
| Example 18 | Good | Excellent | Excellent | Excellent | Excellent |
| Example 19 | Excellent | Good | Excellent | Good | Excellent |
| Example 20 | Excellent | Excellent | Excellent | Excellent | Excellent |
| Example 21 | Fair | Excellent | Fair | Excellent | Fair |
| Comp. Ex. 1 | Excellent | Excellent | Excellent | Excellent | Poor |
| Comp. Ex. 2 | Excellent | Good | Excellent | Good | Poor |
| Comp. Ex. 3 | Poor | Excellent | Poor | Excellent | Poor |
| Comp. Ex. 4 | Poor | Excellent | Poor | Excellent | Good |
| Comp. Ex. 5 | Poor | Poor | Fair | Poor | Poor |
| Comp. Ex. 6 | Excellent | Excellent | Good | Good | Poor |

14 Titanium nitride film
16 Wiring
18 Silicon oxide film
20 Via hole
22 Via hole
24 Interlayer insulating film
26 Titanium nitride film
28 Titanium film
30 Al alloy film
32 Titanium nitride film
34 Wiring
36 Plasma etching residue
38 Interlayer insulating film
40 Barrier metal film
42 Al film
44 Wiring pattern
46 Interlayer insulating film
48 Barrier metal film
50 Tungsten film
52 Via
54 Adhesion film
56 Al film
58 Adhesion film
60 Pad
62 Silicon oxide film
64 Passivation film
66 Opening

What is claimed is:

1. A cleaning method comprising:
   a step of preparing a cleaning composition comprising 57 to 95 wt % of (component a) water, 1 to 40 wt % of (component b) a secondary hydroxy group- and/or tertiary hydroxy group-containing hydroxy compound, (component c) an organic acid, and (component d) a quaternary ammonium compound, the composition having a pH of 5.2 to 10; and
   a step of removing plasma etching residue formed above a semiconductor substrate by means of the cleaning composition.

2. The cleaning method according to claim 1, wherein component b above is a diol compound.

3. The cleaning method according to claim 2, wherein component b above is a compound comprising at least a secondary hydroxy group and a hydroxy group selected from the group consisting of a primary hydroxy group, a secondary hydroxy group and a tertiary hydroxy group.

4. The cleaning method according to claim 3, wherein component b above is a compound selected from the group consisting of dipropylene glycol, 2-methyl-2,4-pentanediol, and 1,3-butanediol.

5. The cleaning method according to claim 1, further comprising (component e) a hydroxylamine and/or a salt thereof.

6. The cleaning method according to claim 1, wherein component c above is a carboxylic acid containing only C, H, and O as constituent elements.

7. The cleaning method according to claim 6, wherein component c above is a compound selected from the group consisting of citric acid, lactic acid, glycolic acid, oxalic acid, acetic acid, propionic acid, valeric acid, isovaleric acid, succinic acid, malic acid, glutaric acid, maleic acid, fumaric acid, phthalic acid, 1,2,3-benzenetricarboxylic acid, salicylic acid, tartaric acid, gluconic acid, and malonic acid.

8. The cleaning method according to claim 1, further comprising (component f) an amino group-containing carboxylic acid.

9. The cleaning method according to claim 8, wherein component f above is histidine or arginine.

10. The cleaning method according to claim 1, further comprising (component g) an inorganic acid and/or a salt thereof.

11. The cleaning method according to claim 10, wherein component g above is a compound selected from the group consisting of phosphoric acid, boric acid, ammonium phosphate, and ammonium borate.

12. A process for producing a semiconductor device, comprising a step of cleaning plasma etching residue formed above a semiconductor substrate using the cleaning method according to claim 1.

13. The process for producing a semiconductor device according to claim 12, wherein the semiconductor substrate comprises aluminum or copper.

14. The cleaning method according to claim 5, wherein component e is a salt of a hydroxylamine.

15. The cleaning method according to claim 5, wherein component e is a compound selected from the group consisting of hydroxylammonium nitrate, hydroxylammonium sulfate, hydroxylammonium phosphate, hydroxylammonium hydrochloride and mixtures thereof.

16. The cleaning method according to claim 1, wherein component d is a tetraalkylammonium hydroxide.

17. The cleaning method according to claim 1, wherein component d is a compound selected from the group consisting of tetramethylammonium hydroxide, tetraethylammonium hydroxide, tetrabutylammonium hydroxide, trimethylhydroxyethylammonium hydroxide, methyltri(hydroxyethyl)ammonium hydroxide, tetra(hydroxyethyl)ammonium hydroxide, and benzyltrimethylammonium hydroxide.

18. The cleaning method according to claim 1, wherein component b is dipropylene glycol.

19. The cleaning method according to claim 1, wherein the composition has a pH of 6 to 10.

20. The cleaning method according to claim 1, wherein the composition has a pH of 6 to 8.

* * * * *